(12) United States Patent
Yee et al.

(10) Patent No.: US 6,889,427 B2
(45) Date of Patent: May 10, 2005

(54) PROCESS FOR DISENGAGING SEMICONDUCTOR DIE FROM AN ADHESIVE FILM

(75) Inventors: Lup Kweun Yee, Chandler, AZ (US); Darrell Jacob Belmas, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 178 days.

(21) Appl. No.: 10/077,538

(22) Filed: Feb. 15, 2002

(65) Prior Publication Data

US 2003/0154597 A1 Aug. 21, 2003

(51) Int. Cl.[7] ............................................ H05K 3/30
(52) U.S. Cl. .................... 29/832; 29/825; 156/344; 156/361; 228/6.2
(58) Field of Search .................... 29/825, 832, 840; 156/344, 361, 234; 228/6.2; 438/118, 113

(56) References Cited

U.S. PATENT DOCUMENTS

| | | | | |
|---|---|---|---|---|
| 4,667,402 A | * | 5/1987 | Wilde | 29/840 |
| 4,850,780 A | * | 7/1989 | Safabakhsh et al. | 414/416.1 |
| 4,859,269 A | * | 8/1989 | Nishiguchi | 156/361 |
| 5,270,260 A | * | 12/1993 | Scheuenpflug | 156/234 |
| 5,343,363 A | | 8/1994 | Greeson et al. | |
| 5,411,921 A | * | 5/1995 | Negoro | 438/118 |
| 5,524,765 A | | 6/1996 | Gutentag | |
| 5,589,029 A | * | 12/1996 | Matsui et al. | 156/344 |
| 6,201,306 B1 | * | 3/2001 | Kurosawa et al. | 257/783 |
| 6,204,092 B1 | * | 3/2001 | Freund et al. | 438/113 |
| 6,555,418 B2 | * | 4/2003 | Kurosawa et al. | 438/118 |
| 6,589,809 B1 | * | 7/2003 | Koopmans | 438/68 |

FOREIGN PATENT DOCUMENTS

| | | |
|---|---|---|
| JP | 57015431 | 1/1982 |
| JP | 62063441 | 3/1987 |
| JP | 62128139 | 6/1987 |
| JP | 01068938 | 3/1989 |
| JP | 05121525 | 5/1993 |
| JP | 07249674 | 9/1995 |
| JP | 10189690 | 7/1998 |

OTHER PUBLICATIONS

PCT/US03/03757 PCT Search Report mailed May 9, 2003.

* cited by examiner

Primary Examiner—Carl J. Arbes

(57) ABSTRACT

An apparatus and method for separating a semiconductor die (303) from an adhesive tape (32) are disclosed. The apparatus includes a blade (34) mechanically coupled to a blade holder (36), wherein the blade (34) is inclined relative to the primary surface of the semiconductor die (303). The method further comprises lifting the semiconductor die (303) while it is attached to the adhesive tape (32) to assist disengagement. The blade (34) facilitates peeling of the semiconductor die (303) from the adhesive tape (32) while distributing stress exerted on the semiconductor die (303) over a larger surface area resulting in reduced die fractures (20).

10 Claims, 5 Drawing Sheets

PROCESS FOR DISENGAGING SEMICONDUCTOR DIE FROM AN ADHESIVE FILM

FIELD OF THE INVENTION

Figure 1:
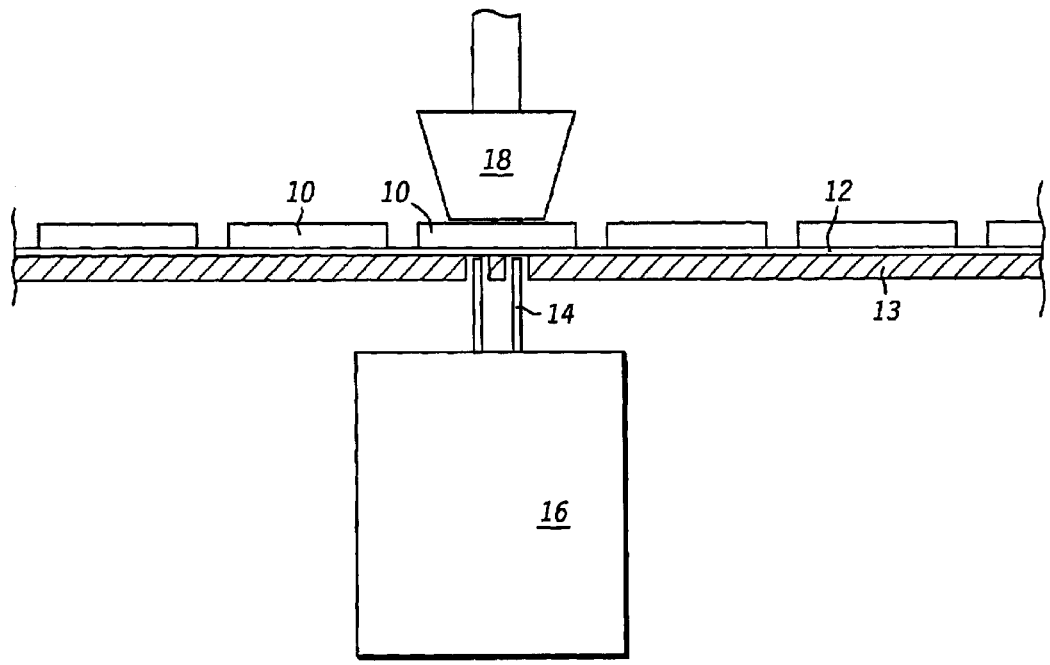

The present invention relates generally to semiconductor manufacturing and more particularly to a process and apparatus for picking die during a die attach operation.

BACKGROUND OF THE INVENTION

Pre-packaging operations of IC chips, which include operations such semiconductor substrate (wafer) mounting, wafer sawing, die separation, die transfer, and die attach are critical operations which demand care while handling wafers and their respective dice and die. Functional die damaged during these operations unnecessarily increase processing costs and reduce yield. One particular type of die substrate susceptible to problems during pre-packaging operations includes gallium arsenide (GaAs). Crystalline GaAs is brittle and predisposed to chipping and cracking.

In a typical pre-packaging operation, after wafers are sorted, they are mounted on adhesive tape. The adhesive tape provides support for the wafers during wafer saw, die transfer, and the die attach operations. The wafer saw cuts the individual dice from the wafer while leaving them on the adhesive tape. After which a die attach operation is performed. Referring now to prior art FIGS. 1 and 2, a typical die attach operation includes removing individual die 10 from the backing tape (adhesive film) 12 and attaching them to a packaging substrate (not shown), i.e., a leadframe, or a plastic or ceramic substrate. Plunge-up needles 14 are projected from a needle holder 16 and push the die from underneath through openings in an anvil 13 causing the die 10 and the adhesive tape 12 to disengage from one another thereby facilitating the transport of the die 10 to a collet (soft rubber vacuum pick-up) 12 on the pick-up head of the die attacher (not shown). The die attacher then aligns the die in its proper orientation and positions it on a die transfer pack or the packaging substrate.

Conventional plunge-up needle configurations and designs are adequate for GaAs die thicker than 4-mil. However, increased performance demands are imposing increased heat dissipation requirements, which in turn are forcing gallium arsenide chip manufacturers to consider designs wherein GaAs substrate thicknesses are on the order of 2-mil or less. At these thicknesses, die transfer tools and die attachers utilizing plunge-up needles to perform adhesive tape die separation operations can produce die fractures, such as the fracture 20 shown in FIG. 2, or even completely break the die. If detected, the fractures result in die scrap. If undetected, the fractures pose a problem with device reliability.

DETAILED DESCRIPTION OF THE DRAWINGS

Figure 2:
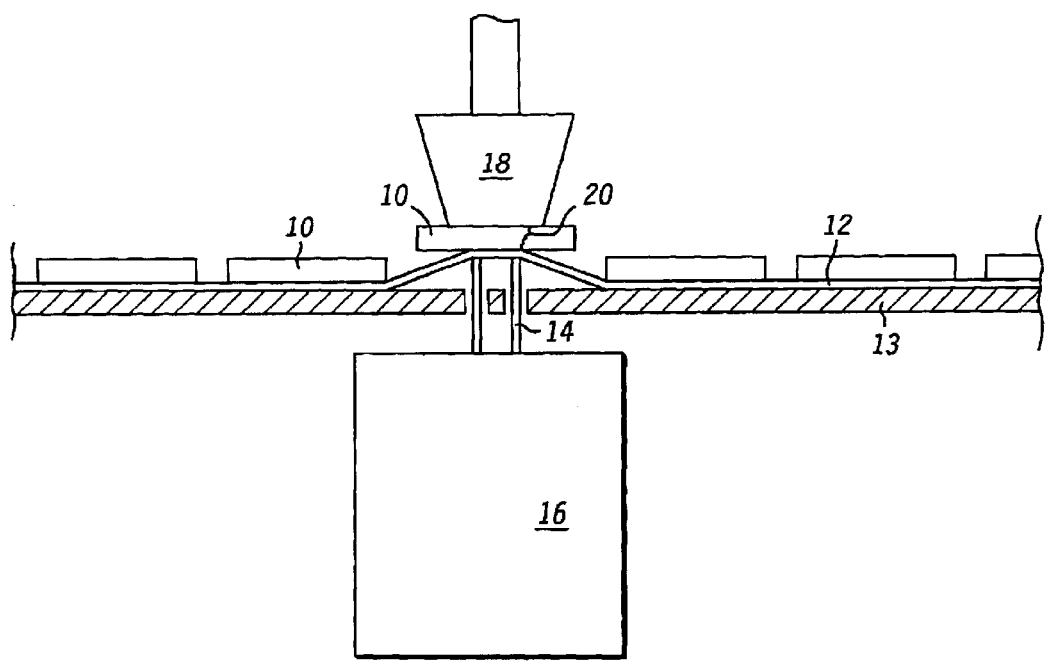

The features and advantages of the present invention will be more clearly understood from the following detailed description taken in conjunction with the accompanying FIGURES where like numerals refer to like and corresponding parts and in which:

FIGS. 1 and 2 include cross-sectional views illustrating a prior art apparatus and method for disengaging a die from an adhesive tape during a die attach operation.

Figure 3:
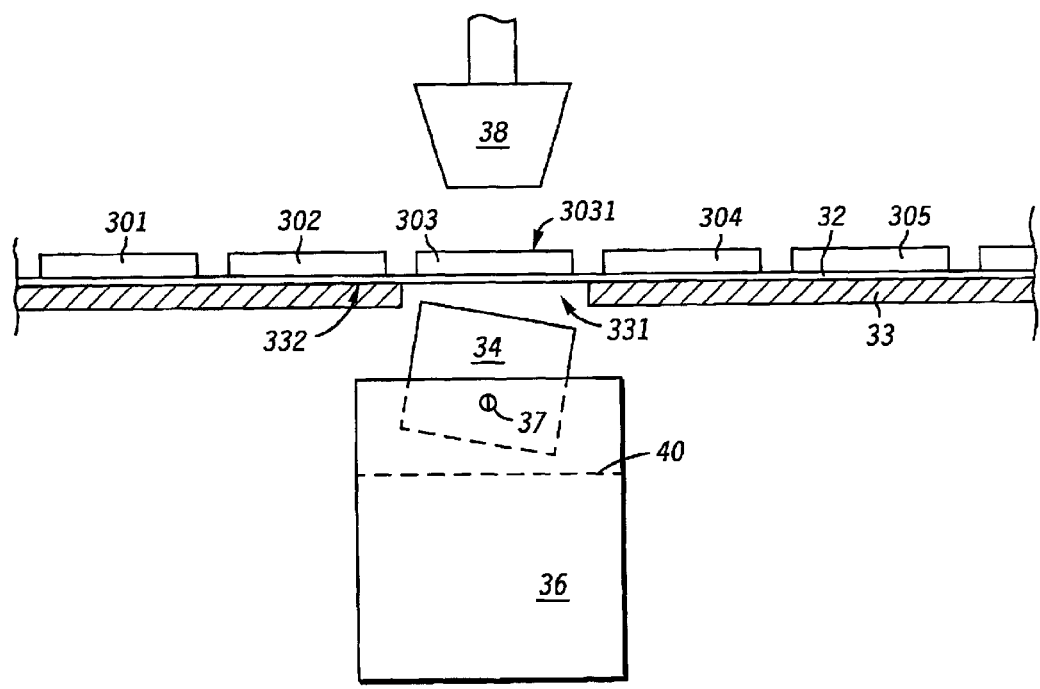
Figure 4:
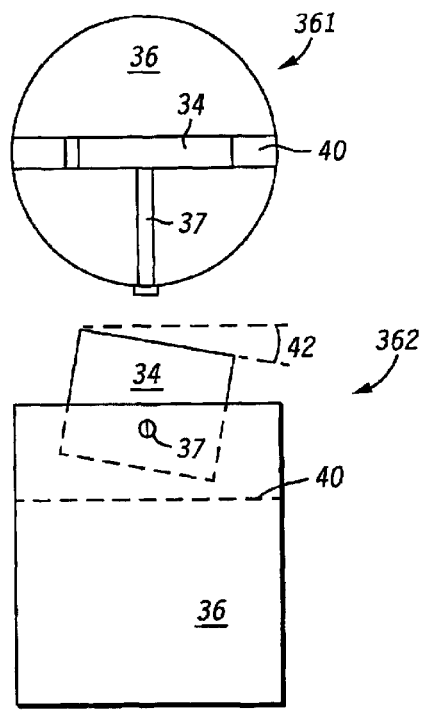
Figure 5:
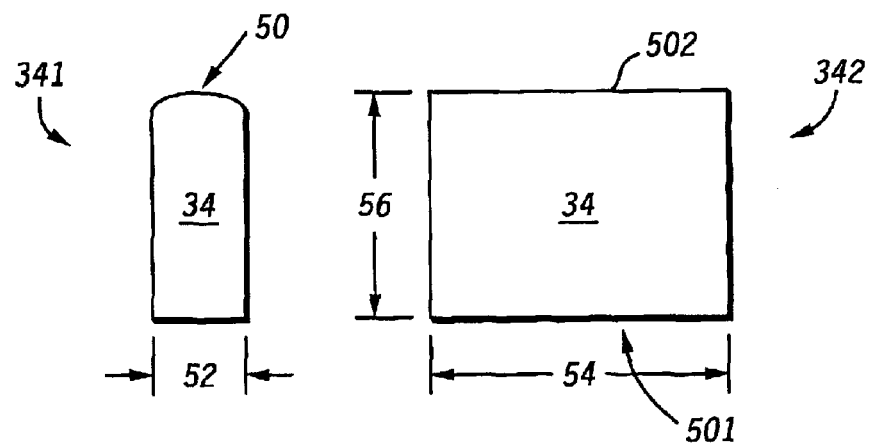
Figure 6:
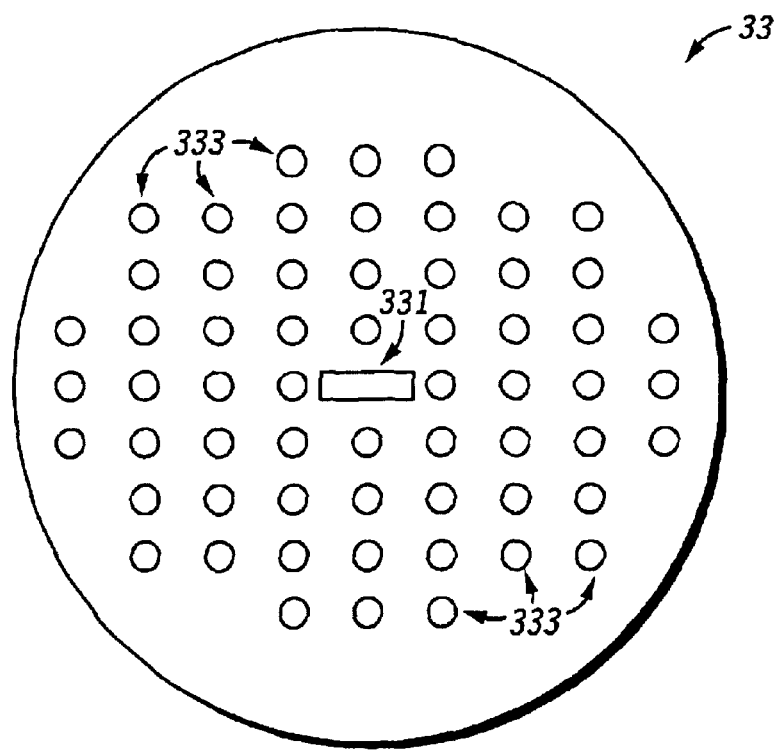

FIGS. 4, 5, and 6 include examples of a design for a plunge-up blade holder, a plunge-up blade, and an anvil, respectively used in accordance with the present invention; and FIGS. 3 and 7–10 include cross-sectional views illustrating a bladed die pick-up apparatus and a method of picking up a die in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention contemplates a method and apparatus for removing die from an adhesive film during a die attach operation. The apparatus includes a blade mechanically coupled to a blade holder, wherein the blade is inclined relative to the primary surface of the semiconductor die. The method further comprises using the blade to lift the semiconductor die while it is attached to the adhesive tape to assist in its disengagement. The blade facilitates peeling of the semiconductor die from the adhesive tape while distributing mechanical stresses exerted on the semiconductor die during the lifting operation across the surface area of the semiconductor die thereby resulting in reduced die fractures. Embodiments of the present invention will now be disclosed in greater detail with reference to the accompanying FIGS. 3–10.

FIG. 3 illustrates a cross-sectional view of a die picking system illustrating an embodiment of the present invention. Included in FIG. 3 are a plurality of semiconductor die 301–305, wherein the bottom surface of the semiconductor die are attached to an adhesive film 32. The adhesive film is mounted a rigid frame (not shown) and placed on an X-Y table (not shown) that controls relative alignment of respective die in the die picking apparatus. The X-Y table is controlled by a series of stepper motors, as know to one of ordinary skill. As shown in FIG. 3, the adhesive film 32 overlies an anvil 33. The anvil 33 includes an aperture opening 331 having a location corresponding with a position for die pick-up processing for a semiconductor die, such as for example die 303. A soft rubber vacuum pickup 38 assists in the detachment of the die from the adhesive film 32 and transports the die 303, after the die separation, to a package (not shown) for subsequent die attach processing. In accordance with an embodiment of the present invention, the plunge-up blade 34 and blade holder 36 replace the prior art needle(s) shown in prior art FIGS. 1 and 2.

Shown in FIGS. 4, 5, and 6 are non-limiting embodiments illustrating examples of designs for the plunge-up blade holder 36, the plunge-up blade 34, and the anvil 33, respectively, for use with the present invention. However, one of ordinary skill in the art recognizes that a variety of design variations and modifications may be incorporated within this embodiment and others that do not depart from the scope and spirit of the present invention. Shown in FIG. 4 is a top view 361 and side view 362 of the blade holder 36 that includes the plunge-up blade 34. Shown in the top view of FIG. 4, one specific implementation of the blade holder design illustrates that it may be cylindrically shaped having a groove 40 that extends through its diameter. The groove 40 is slightly wider than the width of the blade 34. The blade 34 is positioned in the groove 40, set to a desired inclined position as indicated by the angle 42, and then secured with setscrew 37. In alternative embodiments, the blade may be integrally formed as part of the blade holder, or a variety of other blade 34 and groove 40 configurations may be incorporated. For example, a groove or a slot may be milled in the blade holder at a predetermined angle thereby eliminating the need to manually align the blade. The degree of the angle and the blade length are dependent on a variety of factors, such as the size (length and width) and thickness of the die, characteristics of the adhesive film 32, and operational speed of the die picking system. These factors will become apparent during subsequent discussion with respect to operation of the die picking system.

Shown in FIG. 5 is a cross-sectional view 341 and a side view 342 of the blade 34 shown in FIGS. 3 and 4. In one non-limiting embodiment, the blade 34 is designed to have a width 52 of approximately 127 microns (5-mil). For the purposes of this specification 1-mil is equal to 0.001 inches. The top portion 50 of the blade 34 is rounded, wherein the radius of the top rounded portion of the top surface is approximately 127 microns. In one specific integration of the blade 34 and the adhesive tape 32 in the die picking system shown in FIG. 3, it was experimentally determined that a radius substantially less than 5-mil may cause problems with puncturing the adhesive film 32 during the die picking operation. Additionally, diameters significantly greater than 5 mil, such as for example, approximately 508 microns (20-mil), allows too much surface area of the blade to contact adhesive film 32, thereby impeding pick-up of the die by the soft rubber vacuum pickup due to insufficient delamination of the die from the tape.

Included in FIG. 5 is an illustration of the side view 342 of the plunge-up blade 34. Dimensions 54 should be selected such that it corresponds generally to the length or width of a die such as die 303 shown in FIG. 3. However, one of ordinary skill in the art recognizes that this length 54 may depend on a variety of factors that include the dimensions and shape of the die, the adhesive strength of the adhesive film 32, and the amount of vacuum applied by the soft rubber vacuum pickup, which will be discussed subsequently. A rectangle design where the bottom edge 501 is rounded similar to edge corresponding to the top portion of the blade 50 may be incorporated to increase the overall life and use of the blade 34. Thus, when one edge of the blade is damaged or becomes unusable due to over use, the blade can simply be rotated and then edge 501 used to perform the die picking operation. Although the edge 502 is illustrated as being substantially flat with respect to extending along the length 54, it also may be advantageous to slightly curve the edge 502 to create a bend in the surface extending along the length 54 to additionally promote peeling of the die from the adhesive tape.

The previously disclosed design may be characterized as an I-blade design wherein the blade is continuous and extends along a single axis in a single direction. The present invention also contemplates alternative designs, which may include multiple blades that may extend along more than one axis. For example, an X-blade, Y-blade, V-blade or multiple finger-blade design can be incorporated wherein multiple blades contact the adhesive tape along more than one axis to disengage the die. Multiple blade configurations may be particularly helpful by strategically distributing the force exerted on the die during the pick-up operation. In addition, the blade can be designed to include slots, whereby the surface of the blade discontinuous, further reducing the surface area of the blade actually contacting the adhesive tape during the lifting operation.

Shown in FIG. 6 is an anvil 33 designed for use with the plunge-up blade 34. In the center of the anvil is an opening 331. Opening 331 corresponds to the opening 331 in FIG. 3 and is designed to accommodate movement of the plunge-up blade 34 through it. Also shown on the anvil 33 are vacuum ports 333. The vacuum ports are used to secure the adhesive film and die during the die picking operation. For example, after the tape 32 attached to dice 301–305 has been moved to a processing position over the opening 331 by way of an X-Y table, vacuum is applied through the vacuum ports 333 to secure the adhesive tape 32 to the anvil base. As discussed previously with respect to FIG. 5, problems can be encountered with the adhesive film 32 becoming punctured using prior art pins. When this happens problems may be encountered with the ability to adequately secure the adhesive film 32 to the anvil via the vacuum. Thus the present invention is therefore also advantageous from the standpoint that the potential for such punctures is substantially reduced.

Figure 7:
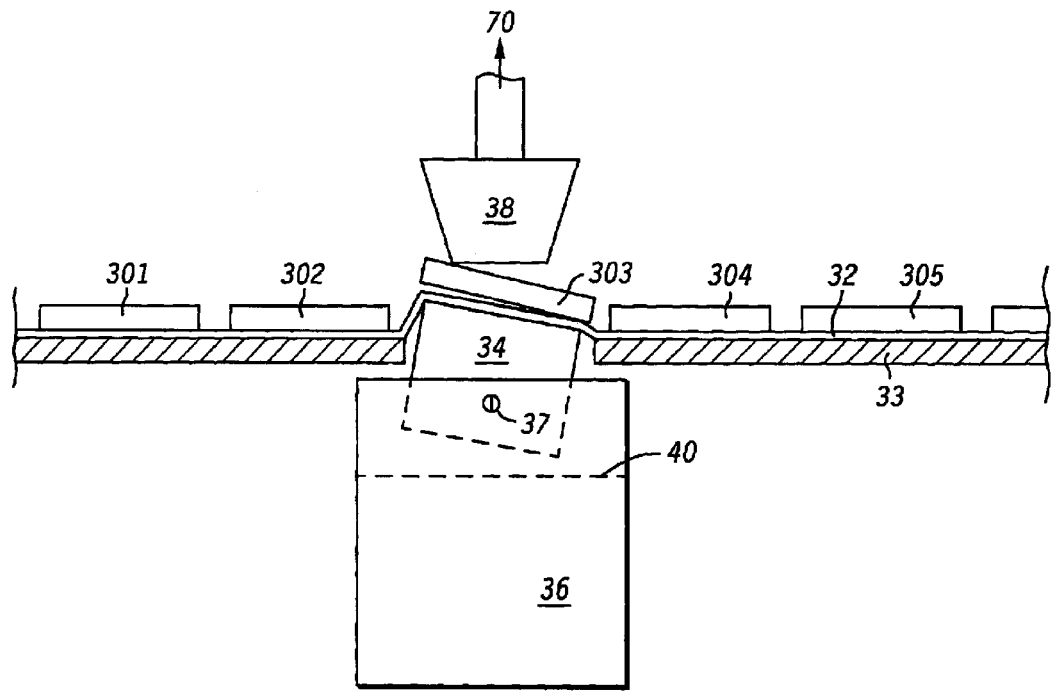

Shown in FIGS. 3 and 7–10, in accordance with an embodiment of the present invention, are a series of processing steps illustrating the use of the plunge-up blade 34 to effectively remove a die 303 from an adhesive film 32 during the die picking portion of a die attach operation. Referring again to FIG. 3, die 303 has been positioned to a processing position corresponding to the opening 331 of the anvil 33. The primary surface 3031 of the semiconductor die 303 is substantially parallel with the surface 332 of the anvil 33, as shown in FIG. 3. During this step of the processing operation, the plunge-up blade 34 and blade holder 36 are in a retracted position relative to the base of the anvil 33. Referring now to FIG. 7, the plunge-up blade 34 and blade holder 36 have been moved to a position where the plunge-up blade 34 is projected through the opening 331 thereby lifting an edge portion of die 303 such that the die is elevated above the plane of the anvil at an angle that substantially corresponds to the incline of the blade 34. The angled blade 34 simultaneously supports the die while promoting peeling during the lifting step, which facilitates separation of the die 303 from the adhesive film 32 with minimal damage to die. In particular to GaAs die, which are much more brittle than semiconductor substrate types such as monocrystalline silicon. The blade provides support for the semiconductor die 303 while it is being lifted above the processing plane of the base of the anvil, thereby reducing stress concentration and distributing the pressure exerted by the blade across a greater surface area of the backside of semiconductor die 303, as compared to the prior art needles. In one embodiment the blade is oriented diagonally relative to the length (or width) of the die 303. In alternative embodiments the blade may also be oriented in directions that are substantially parallel to the length (or width) of the die, or when using multiple blades, they may extend in any combination of directions. A combination of the peeling effect and added support contribute significantly to the overall reduction in fractures observed during die picking operations. The fractures are most notably observed on gallium arsenide die having a thickness less than approximately 63.5 microns (2.5-mil) when using prior art needles to lift the die. The present invention has been successfully used to lift gallium arsenide die having a thickness of less than approximately 25.4 microns (1.0 mil) without producing die fractures. One of ordinary skill in the art recognizes however, that the present invention is not limited to any specific semiconductor device substrate thickness or any particular substrate type. Additionally, unlike the prior art needles, which require leveling of their respective heights relative to the backside of the die to prevent the needle(s) from concentrating too much pressure in a specific areas of the backside of the semiconductor die and causing die fractures and tape puncturing, there is no such leveling requirement using embodiments of the present invention.

As shown in FIG. 7, the soft rubber vacuum pickup 38 is moved into a position that corresponds with a pick-up position to contact or nearly contact the die 303 when the plunge-up blade 34 is in its extended position. The positioning of the soft rubber vacuum pickup 38 can occur prior to, during, or after extension of the blade. When the soft rubber vacuum pick-up is moved to the pick-up position, the vacuum 70 is on or turned on.

Figure 8:
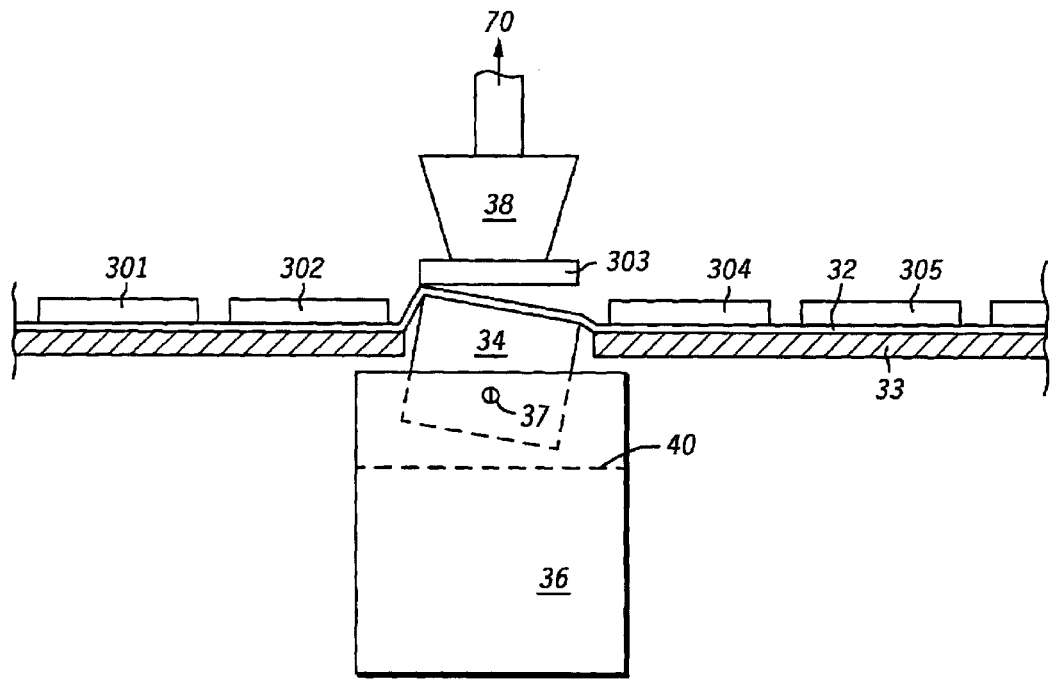
Figure 9:
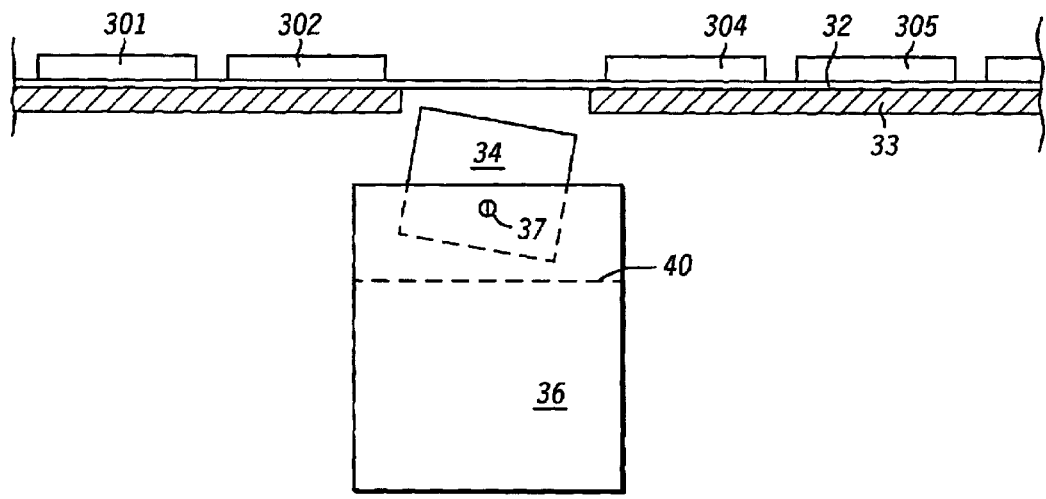
Figure 10:
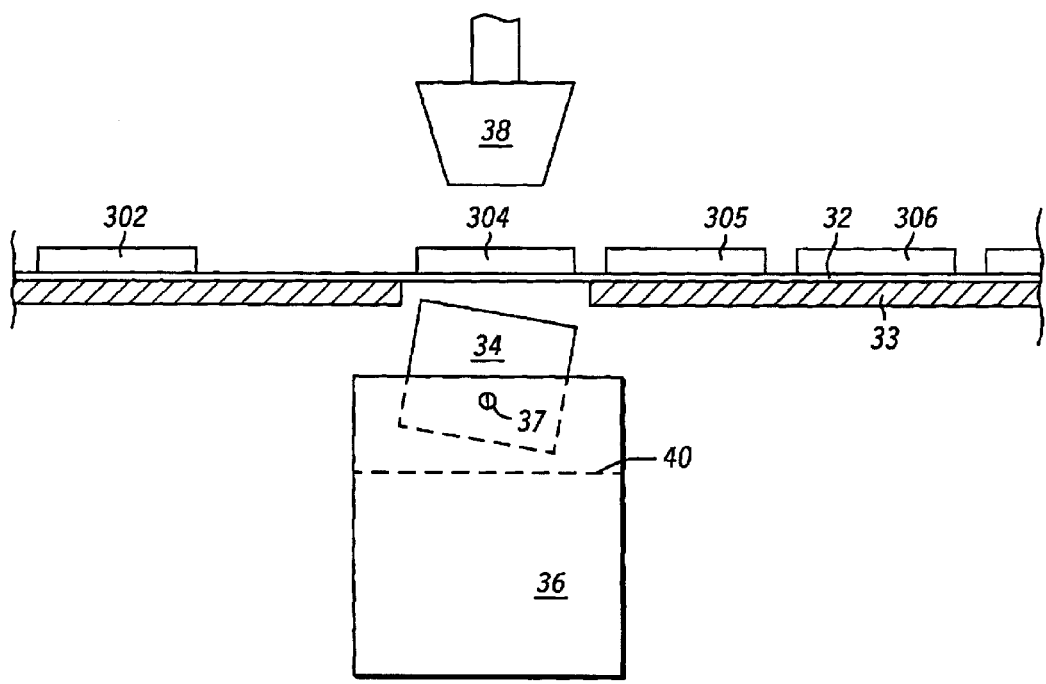

Referring now to FIG. 8, with the vacuum 70 turned on the die 303 can now be completely disengaged from the adhesive film 32. As shown in FIG. 8, the die 303 is now securely mounted to the soft rubber vacuum pickup 38 via the vacuum 70. At this time, the soft rubber vacuum pickup 38, which is holding the die can be moved to a subsequent stage of the die attach operation. Referring now to FIG. 9, the plunge-up blade 34 and blade holder 36 have been moved to their retracted position and the soft rubber vacuum pickup holding die 303 has now been moved to a position for package mounting. As shown in FIG. 9, the adhesive film 32 has substantially retained its original shape and is puncture free. At this point in the processing operation, the die picking process step for die 303 with respect to the plunge-up blade is substantially complete. The vacuum applied to the backside of the adhesive film 32 through the vacuum ports of anvil 33 is turned off and the adhesive tape 32 and dice are moved into a position for die lifting processing of subsequent die. For example, shown in FIG. 10 the adhesive film 32 has been positioned such that die 304 is now in a processing position on the anvil 33 and ready for processing in the die picking operation.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for disengaging a semiconductor die from a film comprising:
   forming a plurality of dice on a semiconductor substrate;
   attaching a bottom surface of the semiconductor substrate to a film
   dicing the semiconductor substrate into a plurality of individual die, wherein a bottom surface of the plurality of individual die remains attached to the film;
   disengaging a semiconductor die from the film, wherein disengaging further comprises:
      placing the plurality of individual die on an anvil;
      aligning a semiconductor die over an opening in the anvil;
      projecting a blade through the opening in the anvil to facilitate separation of the semiconductor die from the film, wherein the blade has a surface for disengaging the semiconductor die from the film that is inclined relative to a bottom surface of the semiconductor die; and
      lifting an edge portion of the semiconductor die above a surface of the anvil with the blade to facilitate disengagement the semiconductor die from the film.

2. The method of claim 1, wherein the semiconductor die is further characterized as gallium arsenide semiconductor die.

3. The method of claim 2, wherein a thickness of the semiconductor die is less than approximately 63.5 microns.

4. The method of claim 3, wherein a thickness of the semiconductor die is less than approximately 25.4 microns.

5. The method of claim 1, wherein the blade extends along more than one axis of the semiconductor die.

6. The method of claim 1. wherein the blade is slotted.

7. The method of claim 1, wherein the blade is oriented diagonally with respect to one of a length and width of the semiconductor die.

8. The method of claim 1, wherein a radius of a surface of the blade contacting the adhesive tape is approximately 127 microns.

9. The method of claim 1, further comprising picking up the semiconductor die after the step of lifting, wherein picking up the semiconductor die includes completely detaching the semiconductor die from the film.

10. The method of claim 1, wherein the film is further characterized as an adhesive tape.

* * * * *